United States Patent
Wu et al.

(10) Patent No.: US 9,859,165 B1
(45) Date of Patent: Jan. 2, 2018

(54) PLANARIZATION PROCESS FOR FORMING SEMICONDUCTOR DEVICE STRUCTURE

(71) Applicant: Taiwan Semiconductor Manufacturing Co., Ltd., Hsinchu (TW)

(72) Inventors: Li-Chieh Wu, Hsinchu (TW); Hui-Chi Huang, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/223,068

(22) Filed: Jul. 29, 2016

(51) Int. Cl.
    *H01L 21/02* (2006.01)
    *H01L 21/8234* (2006.01)
    *H01L 21/3105* (2006.01)
    *H01L 21/28* (2006.01)
    *H01L 29/66* (2006.01)
    *H01L 29/40* (2006.01)
    *H01L 29/49* (2006.01)

(52) U.S. Cl.
    CPC .. *H01L 21/823437* (2013.01); *H01L 21/0217* (2013.01); *H01L 21/02164* (2013.01); *H01L 21/28247* (2013.01); *H01L 21/31053* (2013.01); *H01L 29/401* (2013.01); *H01L 29/4966* (2013.01); *H01L 29/66545* (2013.01)

(58) Field of Classification Search
    CPC ....... H01L 21/823437; H01L 21/31053; H01L 21/28247; H01L 21/0217; H01L 21/02164; H01L 29/4966; H01L 29/66545; H01L 29/401
    See application file for complete search history.

(56) References Cited

U.S. PATENT DOCUMENTS

2014/0084383 A1* 3/2014 Cai .................. H01L 29/66545
                                                  257/401

* cited by examiner

*Primary Examiner* — Nadine Norton
*Assistant Examiner* — Mahmoud Dahimene
(74) *Attorney, Agent, or Firm* — McClure, Qualey & Rodack, LLP

(57) ABSTRACT

A method for forming a semiconductor device structure is provided. The method includes receiving a structure having a first portion and a second portion, and a top surface of the first portion is higher than a top surface of the second portion. The method also includes forming a first material layer over the first portion and the second portion of the structure and forming a first material layer over the first portion and the second portion of the structure. The method further includes thinning the second material layer until the first material layer is exposed and removing a portion of the second material layer over the second portion of the structure to expose the first material layer thereunder. In addition, the method includes thinning the first material layer to expose the structure.

20 Claims, 13 Drawing Sheets

PLANARIZATION PROCESS FOR FORMING SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

In recent decades, the chemical mechanical polishing (CMP) process has been used to planarize layers to build up ICs, thereby helping to provide more precisely structured device features on the ICs. The CMP process is a planarization process that combines chemical removal with mechanical polishing. The CMP polishes and removes materials from the wafer, and works on multi-material surfaces.

However, these advances have increased the complexity of processing and manufacturing ICs. Since feature sizes continue to decrease, fabrication processes including the CMP processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
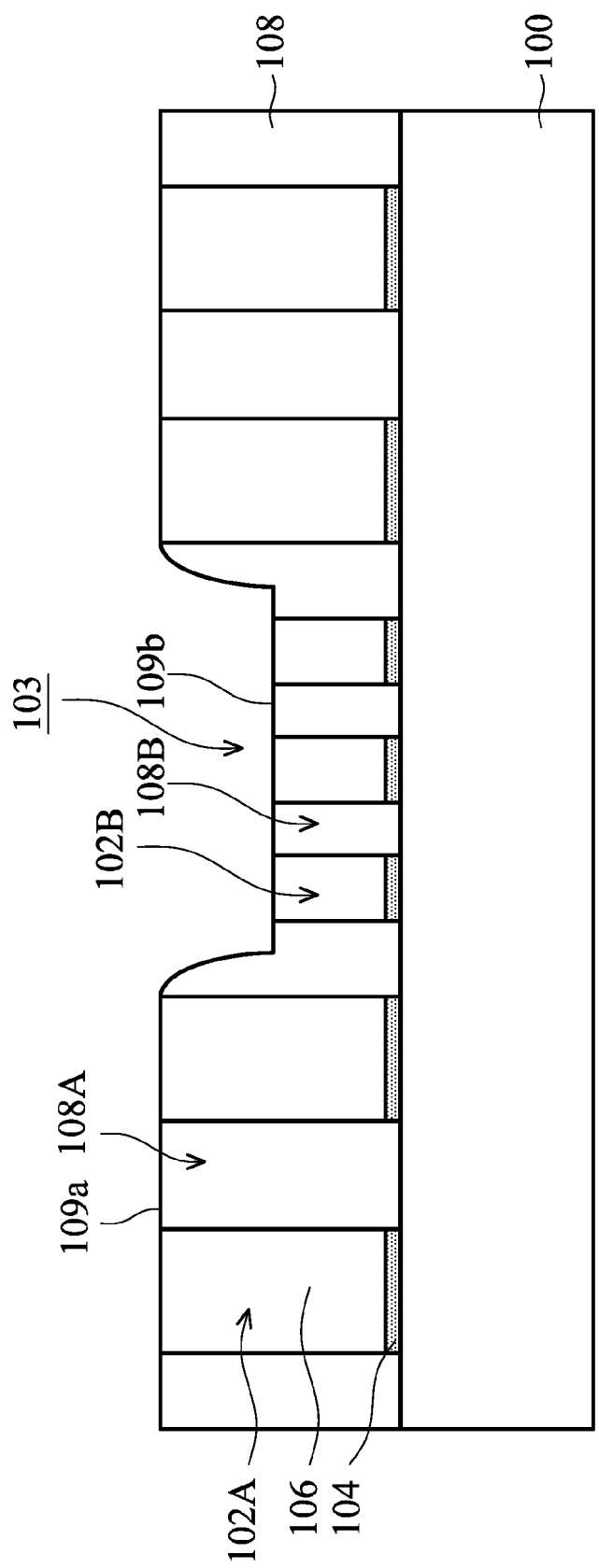
FIGS. 1A-1H are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1H are cross-sectional views of various stages of a process for forming a semiconductor device structure, in accordance with some embodiments. As shown in FIG. 1A, multiple gate stacks including gate stacks 102A and 102B are formed over a semiconductor substrate 100. In some embodiments, the semiconductor substrate 100 includes a semiconductor wafer, a portion of a semiconductor wafer, or a semiconductor die. The semiconductor wafer (such as a silicon wafer) may contain device elements such as active devices and/or passive devices. In some embodiments, the semiconductor substrate 100 includes silicon or other elementary semiconductor materials such as germanium.

In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the gate stacks 102A and 102B are dummy gate stacks which will be replaced with other gate stacks, such as metal gate stacks. In some embodiments, each of the gate stacks 102A is wider than each of the gate stacks 102B. In some embodiments, each of the gate stacks 102A is higher than each of the gate stacks 102B. Top surfaces of the gate stacks 102A are higher than those of the gate stacks 102B. Many variations and/or modifications can be made to embodiments of the disclosure. In some embodiments, each the gate stacks 102A is substantially as wide as each of the gate stacks 102B. In some other embodiments, each of the gate stacks 102B is wider than each of the gate stacks 102A.

In some embodiments, each of the gate stacks 102A and 102B includes a gate dielectric layer 104 and a gate electrode layer 106. In some embodiments, the gate dielectric layer 104 is made of silicon oxide, and the gate electrode layer 106 is made of polysilicon. Spacer elements (not shown) may be formed on sidewalls of the gate stacks 102A and 102B. In some embodiments, source/drain features (not shown) are formed in the semiconductor substrate 100 and are adjacent to the gate stacks 102A and 102B.

As shown in FIG. 1A, a dielectric layer 108 is formed over the semiconductor substrate 100 to surround the gate stacks 102A and 102B, in accordance with some embodiments. The dielectric layer 108 has a first portion 108A and a second portion 108B. In some embodiments, a top surface 109a of the first portion 108A is substantially coplanar with a top of one of the gate stacks 102A. In some embodiments, a top surface 109b of the second portion 108B is substantially coplanar with a top of one of the gate stacks 102B. The structure shown in FIG. 1A has a recess 103.

In some embodiments, the dielectric layer 108 is made of silicon oxide, silicon oxynitride, borosilicate glass (BSG), phosphoric silicate glass (PSG), borophosphosilicate glass (BPSG), fluorinated silicate glass (FSG), low dielectric constant (low-k) material, another suitable material, or a combination thereof. In some embodiments, the dielectric layer 108 includes multiple sub-layers. The low-k material may have a dielectric constant smaller than that of silicon dioxide. For example, the low-k material has a dielectric constant in a range from about 1.5 to about 3.5. As the density of semiconductor devices increases and the size of circuit elements becomes smaller, the resistance capacitance (RC) delay time increasingly dominates circuit performance. Therefore, using a low-k dielectric material as the dielectric layer 108 is helpful for reducing the RC delay.

In some embodiments, a dielectric material layer is deposited over the semiconductor substrate 100 and the gate stacks 102A and 102B. The dielectric material layer may be deposited using a chemical vapor deposition (CVD) process, an atomic layer deposition (ALD) process, a spin-on process, another applicable process, or a combination thereof. Afterwards, a planarization process is applied to thin down the dielectric material layer. As a result, the thinned dielectric material layer forms the dielectric layer 108 with the first portion 108A and the second portion 108B, as shown in FIG. 1A.

Figure 1B:
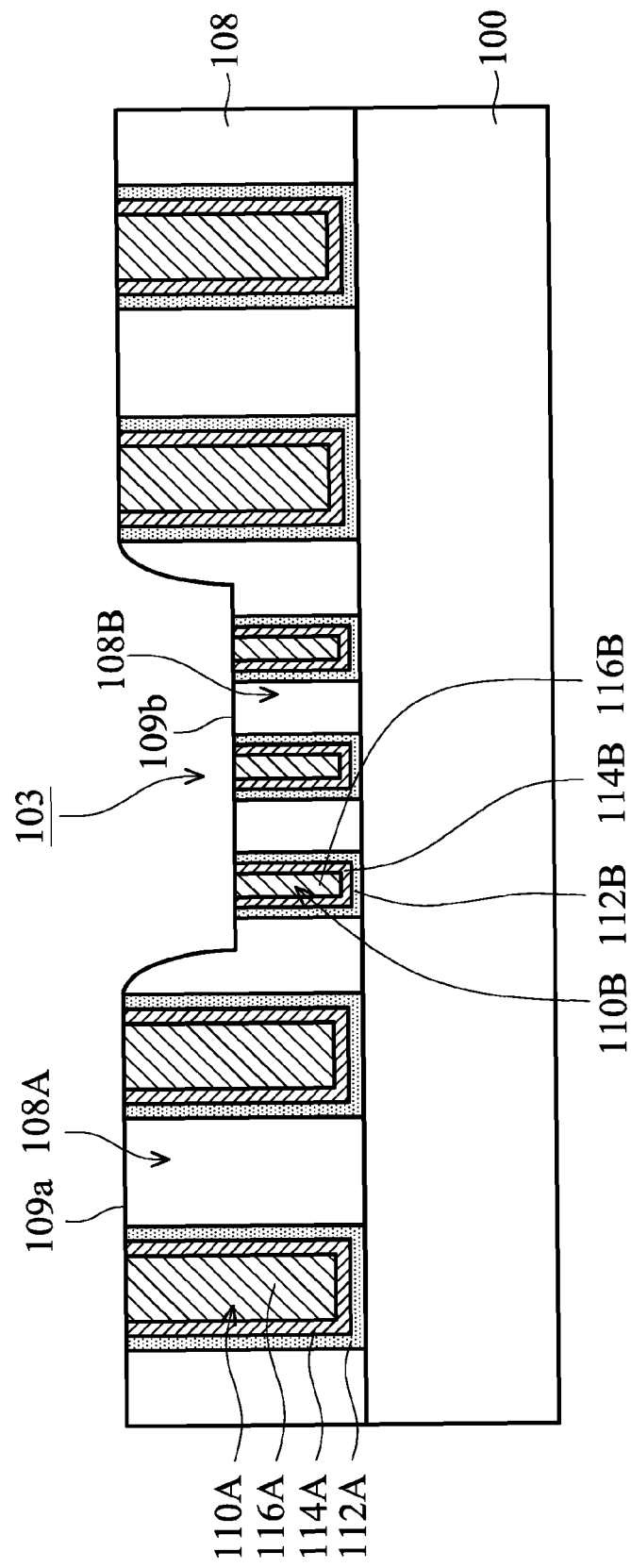

As shown in FIG. 1B, metal gate stacks 110A and 110B are formed to respectively replace the gate stacks 102A and 102B, in accordance with some embodiments. Each of the metal gate stacks 110A includes a gate dielectric layer 112A, a work function layer 114A, and a conductive filling layer 116A. Each of the metal gate stacks 110B includes a gate dielectric layer 112B, a work function layer 114B, and a conductive filling layer 116B. As shown in FIG. 1B, tops of the metal gate stacks 110A and 110B may be substantially coplanar with the top surfaces 109a and 109b, respectively.

The gate dielectric layers 112A and 112B may be made of a high dielectric constant (high-k) material. The high-k material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The work function layers 114A and 114B are used to provide the desired work function for transistors to enhance device performance. In some embodiments, the work function layer 114A or 114B is an n-type metal layer capable of providing a work function value suitable for the device, such as equal to or less than about 4.5 eV. In some embodiments, the work function layer 114A or 114B is a p-type metal layer capable of providing a work function value suitable for the device, such as equal to or greater than about 4.8 eV. In some embodiments, the work function layers 114A and 114B are metal layers with the same type, such as n-type metal layers. In some other embodiments, the work function layers 114A and 114B are metal layers with different types. For example, the work function layer 114A is an n-type metal layer, and the work function layer 114B is a p-type metal layer.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The thickness and/or the compositions of the work function layers 114A and 114B may be fine-tuned to adjust the work function level. For example, a titanium nitride layer may be used as a p-type metal layer or an n-type metal layer, depending on the thickness and/or the compositions of the titanium nitride layer.

In some embodiments, a barrier layer (not shown) is formed between the gate dielectric layer and the work function layer. The barrier layer may be made of titanium nitride, tantalum nitride, another suitable material, or a combination thereof. In some embodiments, a blocking layer (not shown) is formed over the work function layer before the formation of the conductive filling layers 116A and 116B. The blocking layer may be made of tantalum nitride, titanium nitride, another suitable material, or a combination thereof. In some embodiments, the conductive filling layers 116A and 116B are made of aluminum, tungsten, titanium, gold, another suitable material, or a combination thereof.

The formation of the metal gate stacks 110A and 110B may involve multiple etching processes for removing the gate stacks 102A and 102B, multiple deposition processes for forming multiple layers, and one or more planarization processes.

Figure 1C:
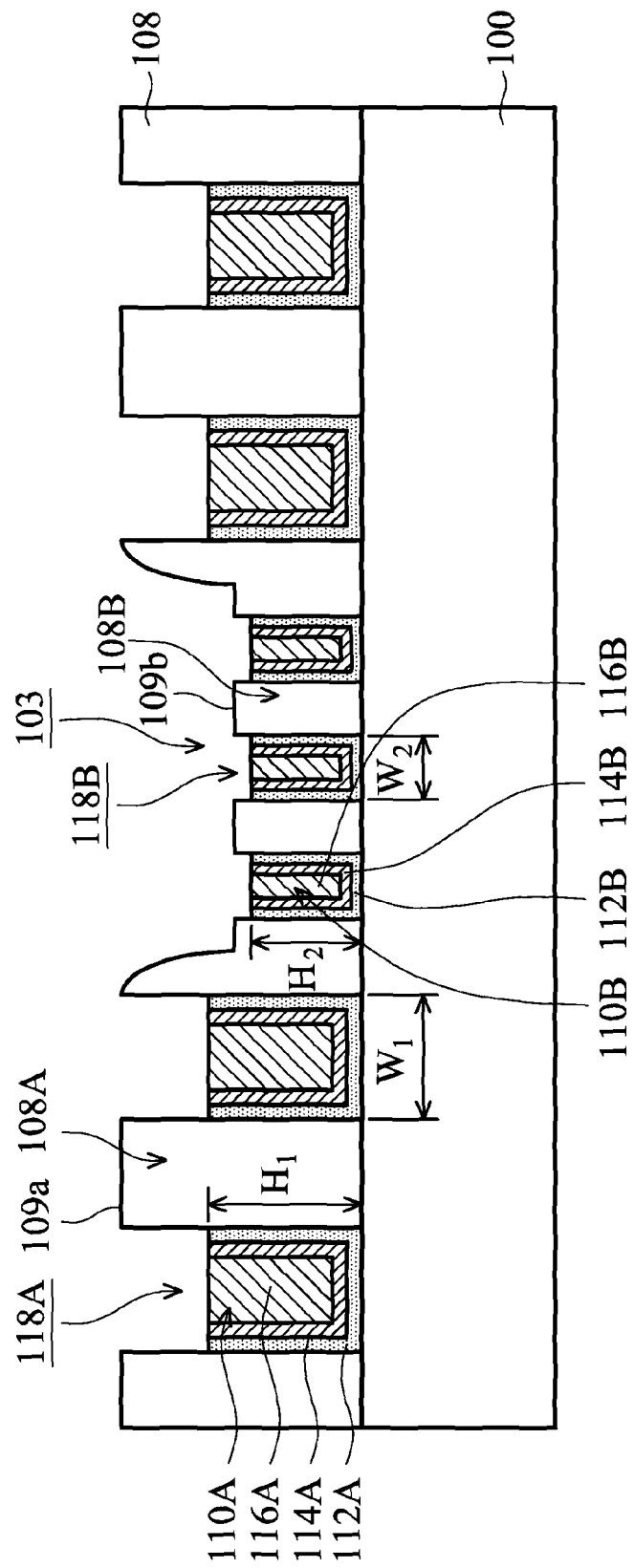

As shown in FIG. 1C, upper portions of the metal gate stacks 110A and 110B are removed, in accordance with some embodiments. In some embodiments, the metal gate stacks 110A and 110B are etched back to form recesses 118A and 118B on the metal gate stacks 110A and 110B, respectively. The recesses 118A and 118B are also surrounded by the dielectric layer 108, as shown in FIG. 1C. In some embodiments, each of the recesses 118A is deeper than each of the recesses 118B. As shown in FIG. 1C, each of the metal gate stacks 110A has a height $H_1$ and a width $W_1$, and each of the metal gate stacks 110B has a height $H_2$ and a width $W_2$. In some embodiments, the height $H_1$ is greater than the height $H_2$. In some embodiments, the width $W_1$ is greater than the width $W_2$.

Figure 1D:
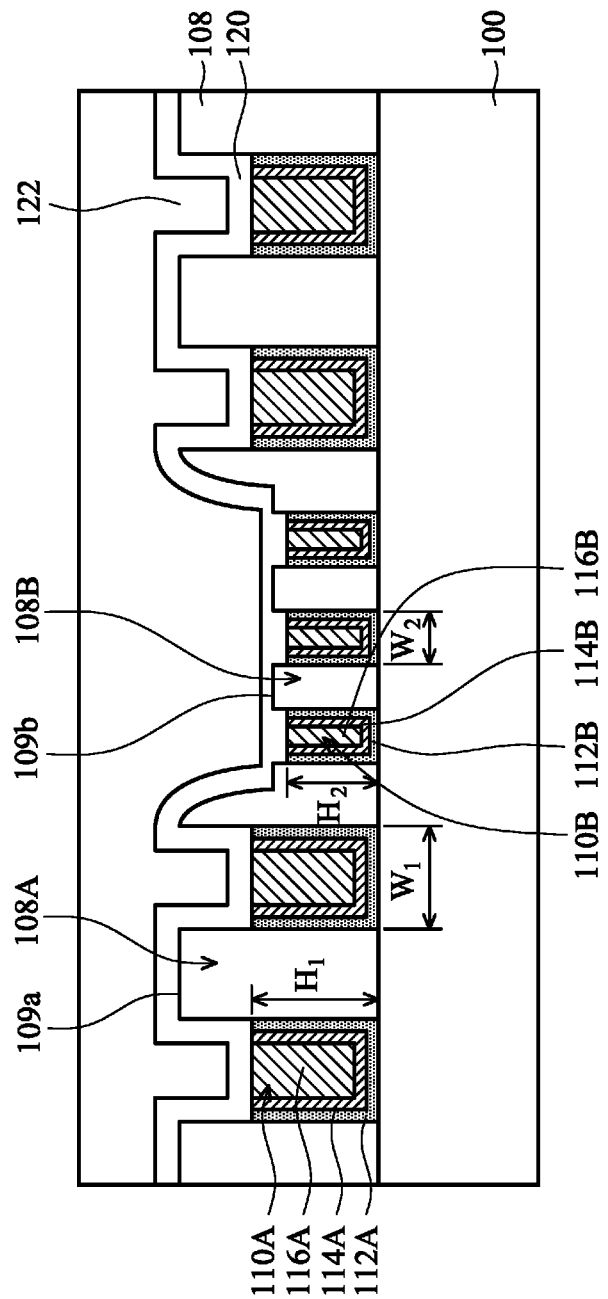

As shown in FIG. 1D, a material layer 120 is deposited over the structure shown in FIG. 1C, in accordance with some embodiments. The material layer 120 covers the first portion 108A and the second portion 108B of the dielectric layer 108. In some embodiments, the material layer 120 extends on a sidewall and a bottom of the recess 103. In some embodiments, the material layer 120 extends into the recesses 118A on the metal gate stacks 110A and fills the recesses 118B on the metal gate stacks 110B. The material layer 120 may extend on the sidewalls and bottoms of the recesses 118A, as shown in FIG. 1D.

In some embodiments, the material layer 120 functions as a stop layer for a subsequent planarization process and a subsequent etching process. In some embodiments, the material layer 120 is made of silicon nitride, silicon oxynitride, silicon oxide, another suitable material, or a combination thereof. In some embodiments, the material layer 120 is made of silicon nitride. In some other embodiments, the material layer 120 is made of a metal material, a semiconductor material, a polymer material, a dielectric material, another suitable material, or a combination thereof. In some embodiments, the material layer 120 is deposited using a CVD process, an ALD process, a physical vapor deposition (PVD) process, a spin-on process, a spray coating process, another applicable process, or a combination thereof.

Afterwards, a second material layer 122 is deposited over the material layer 120 to fill the recess 103, as shown in FIG. 1D in accordance with some embodiments. In some embodiments, the second material layer 122 fills the recesses 118A on the metal gate stacks 110A. In some embodiments, the second material layer 122 is thicker than the material layer 120.

In some embodiments, the second material layer 122 and the material layer 120 are made of different materials. In some embodiments, the second material layer 122 is made of silicon oxide, silicon oxynitride, silicon nitride, another suitable material, or a combination thereof. In some embodiments, the second material layer 122 is made of silicon oxide. In some other embodiments, the second material layer 122 is made of a metal material, a semiconductor material, a polymer material, a dielectric material, another suitable material, or a combination thereof. In some embodiments, the second material layer 122 is deposited using a CVD process, an ALD process, a physical vapor deposition (PVD) process, a spin-on process, a spray coating process, another applicable process, or a combination thereof.

Figure 1E:
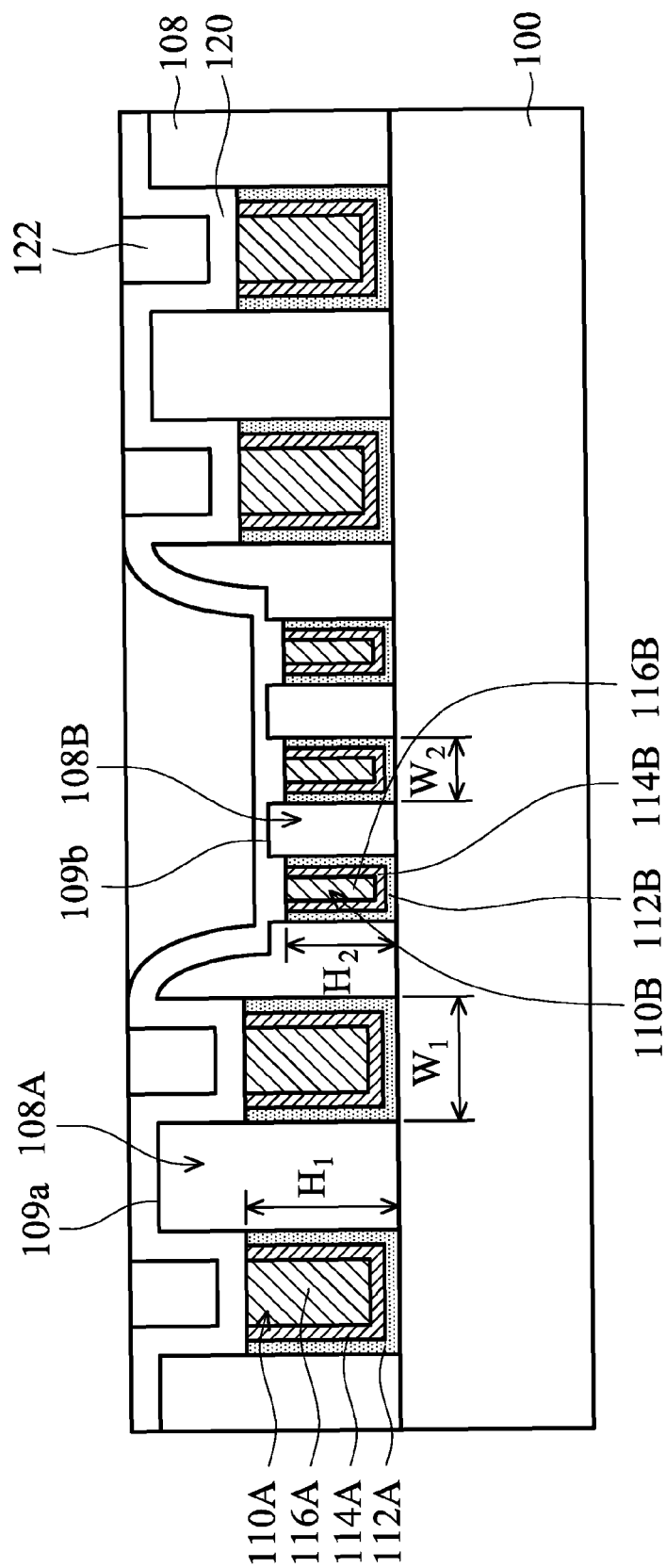

As shown in FIG. 1E, the second material layer 122 is thinned until the material layer 120 over the first portion 108A of the dielectric layer 108 is exposed, in accordance with some embodiments. In some embodiments, after the thinning of the second material layer 122, the top surfaces of the second material layer 122 and the material layer 120 are substantially coplanar with each other. In some embodiments, the second material layer 122 is thinned using a planarization process. The planarization process may include a chemical mechanical polishing (CMP) process, a grinding process, a dry polishing process, another applicable process, or a combination thereof. In some embodiments, the second material layer 122 is thinned using a CMP process, and the material layer 120 acts as a stop layer for the CMP process.

Figure 1F:
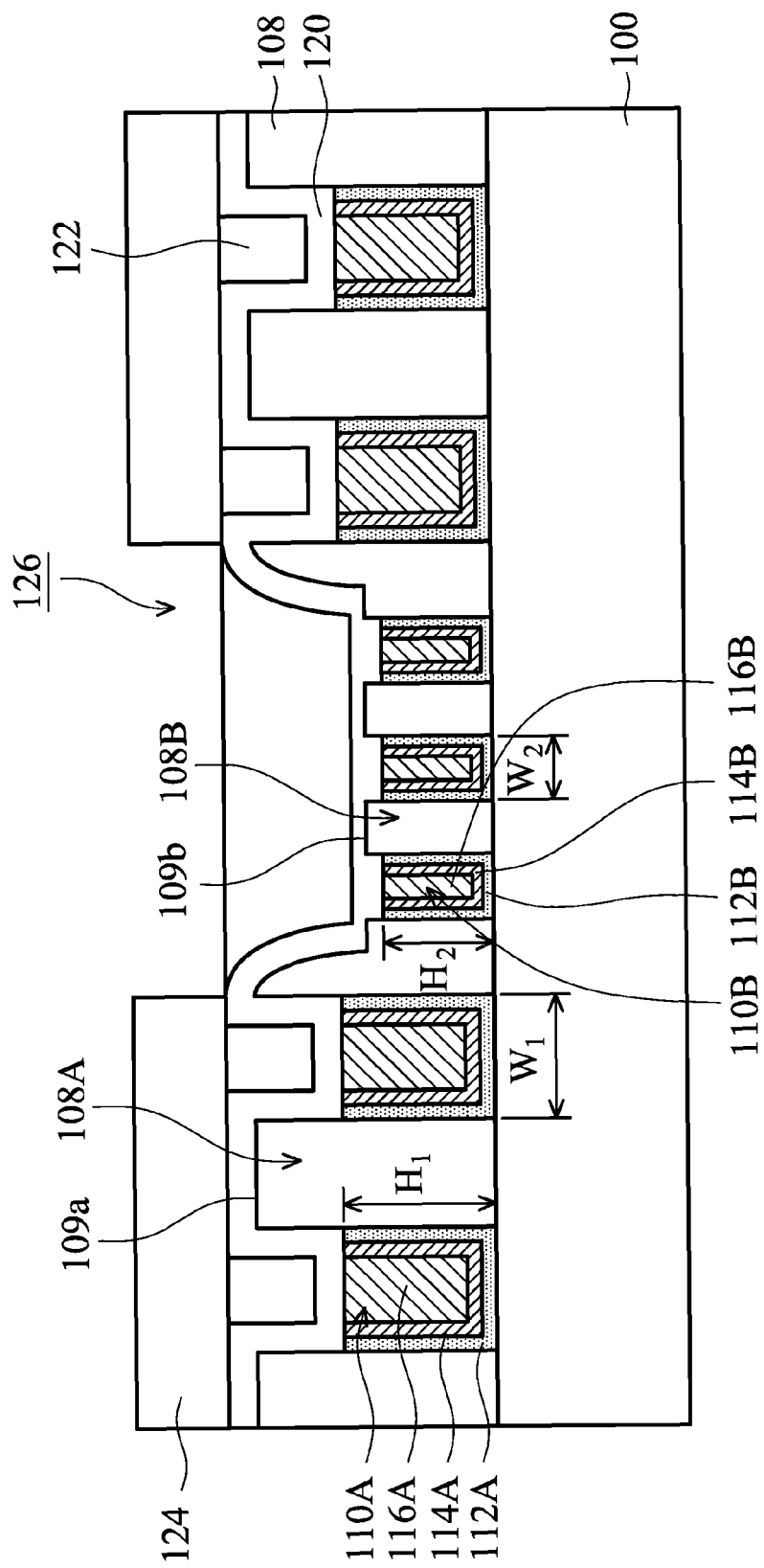

As shown in FIG. 1F, a mask layer 124 is formed over the material layer 120, in accordance with some embodiments. An opening 126 is formed in the mask layer 124. The opening 126 exposes the portion of the second material layer 122 over the second portion 108B of the dielectric layer 108, as shown in FIG. 1F. In some embodiments, the mask layer 124 covers the portions of the second material layer 122 filling the recesses 118A on the metal gate stacks 110A. In some embodiments, the mask layer 124 is a patterned photoresist layer. In some embodiments, a photoresist layer is coated over the structure shown in FIG. 1E and then patterned using a photolithography process to form the mask layer 124. The mask layer 124 may protect the portions of the second material layer 122 filling the recesses 118A from being removed during a subsequent etching process.

Figure 1G:
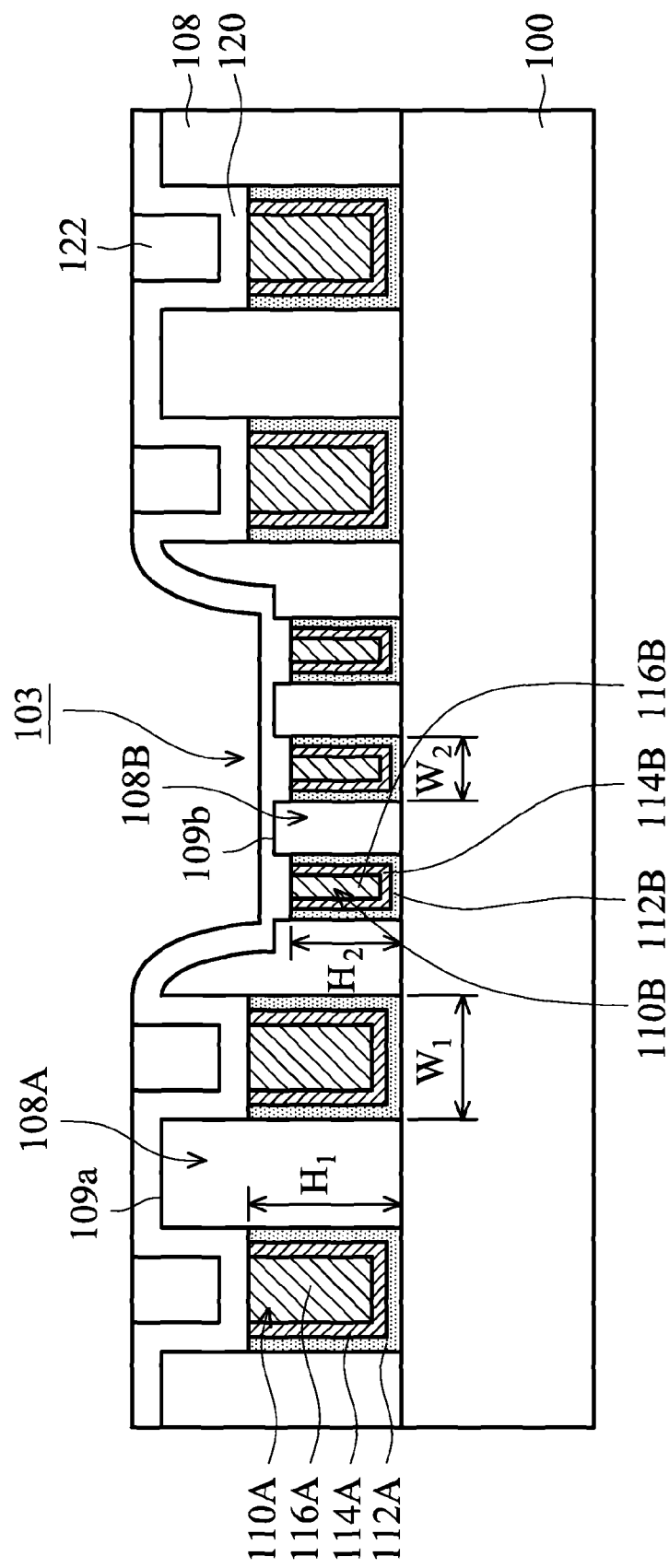

As shown in FIG. 1G, the exposed portion of the second material layer 122 is removed through the opening 126 of the mask layer 124, in accordance with some embodiments. In some embodiments, the exposed portion of the second material layer 122 is removed using an etching process. As a result, the second material layer 122 is removed from the recess 103, as shown in FIG. 1G. During the etching of the exposed portion of the second material layer 122, the material layer 120 thereunder may act as an etch stop layer.

Afterwards, the mask layer 124 is removed, as shown in FIG. 1G in accordance with some embodiments.

Figure 1H:
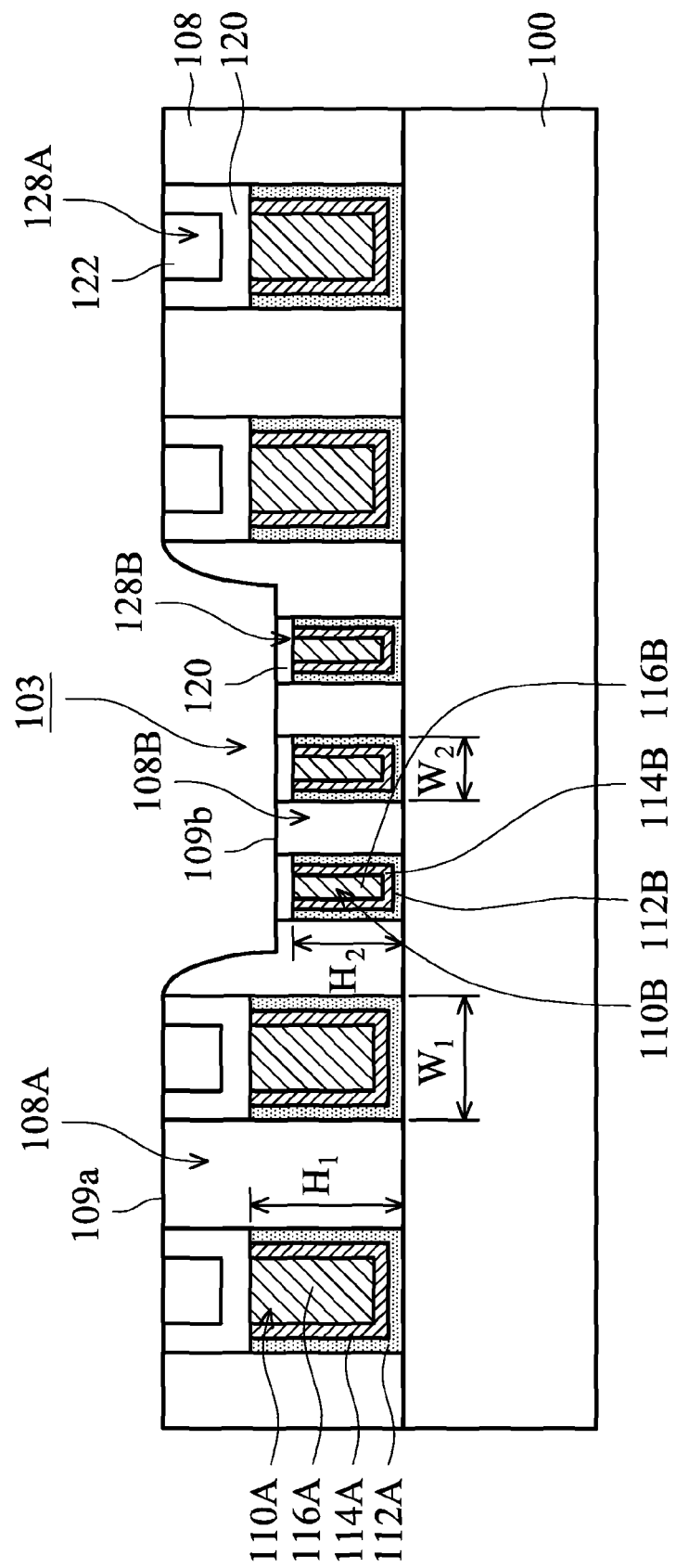

As shown in FIG. 1H, the material layer 120 is thinned until the first portion 108A and the second portion 108B of the dielectric layer 108 are exposed, in accordance with some embodiments. The sidewall and the bottom of the recess 103 may also be exposed. The second material layer 122 may also be thinned together with the material layer 120. In some embodiments, after the thinning of the material layer 120 and the second material layer 122, cap elements 128A and 128B are formed on the metal gate stacks 110A and 110B, respectively. The remaining portions of the material layer 120 and the second material layer 122 on the metal gate stacks 110A form the cap elements 128A. The remaining portions of the material layer 120 on the metal gate stacks 110B form the cap elements 128B. In some embodiments, top surfaces of the cap elements 128A are substantially coplanar with the top surface 109a of the first portion 108A of the dielectric layer 108. In some embodiments, top surfaces of the cap elements 128B are substantially coplanar with the top surface 109b of the second portion 108B of the dielectric layer 108.

In some embodiments, the material layer 120 is thinned using a planarization process. The planarization process may include a chemical mechanical polishing (CMP) process, a grinding process, a dry polishing process, an etching process, another applicable process, or a combination thereof. In some embodiments, the material layer 120 is thinned using a CMP process.

In some cases, the portion of the second material layer 122 on the second portion 108B of the dielectric layer 108 is not previously removed, but is removed during a planarization process for forming the cap elements 128A and 128B. In order to ensure that the portion of the second material layer 122 on the second portion 108B of the dielectric layer 108 is completely removed, the planarization process may need to be performed for a longer time. As a result, the upper portions of the cap elements 128A or even the upper portions of the metal gate stacks 110A may be removed or damaged.

In accordance with some embodiments of the disclosure, because the portion of the second material layer 122 on the second portion 108B of the dielectric layer 108 has been previously removed (as shown in FIGS. 1E-1G), the planarization process is mainly used for removing the portions of the first material layer 120 outside of the recesses 118A and 118B on the metal gate stacks 110A and 110B. The planarization is performed for a shorter time. Therefore, the cap elements 128A are prevented from being removed or damaged too much during the thinning of the material layer 120.

Each of the cap elements 128A and 128B may have a desired thickness. The first portion 108A of the dielectric layer 108 may also be prevented from being removed or damaged during the thinning of the material layer 120. The material loss may be minimized such that a subsequent residue clean operation may be easier. The uniformity control of the planarization process (such as a CMP process) may also be improved.

Figure 2:
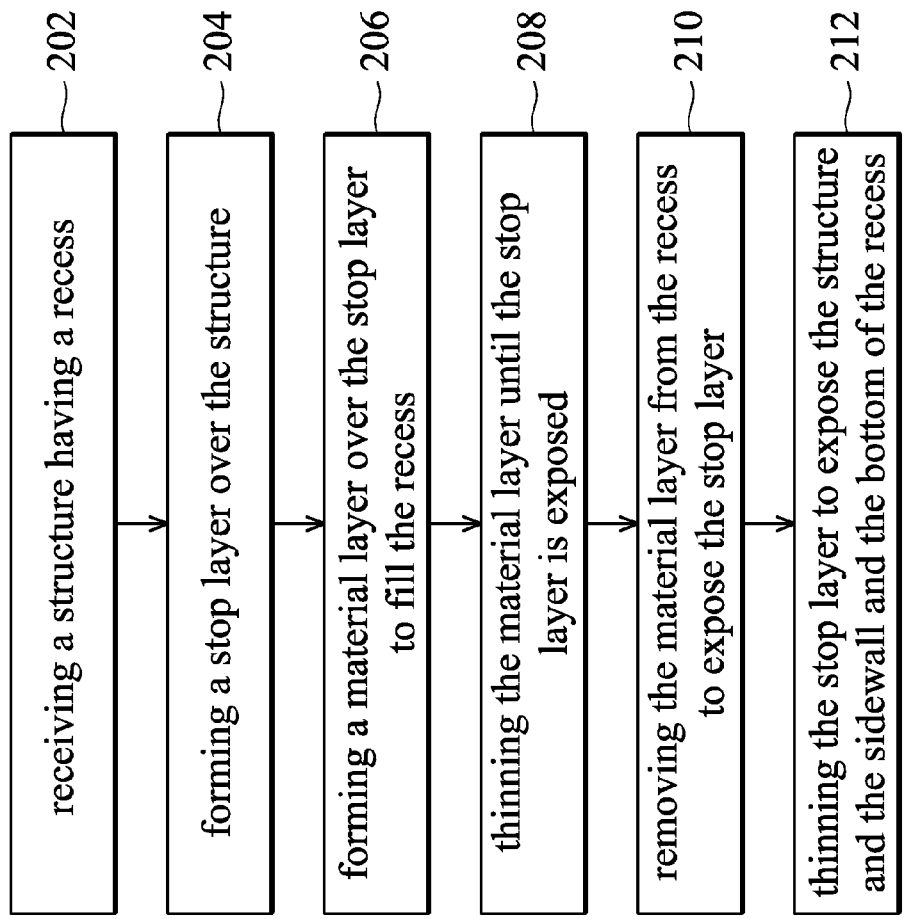
FIG. 2 is a flow chart of a method for forming a semiconductor device structure, in accordance with some embodiments.

FIG. 2 is a flow chart of a method for forming a semiconductor device structure, in accordance with some embodiments. The method includes an operation 202 in which a structure having a recess is received. The method continues with an operation 204 in which a stop layer is formed over the structure. In some embodiments, the stop layer extends on a sidewall and a bottom of the recess. Afterwards, the method continues with an operation 206 in which a material layer is formed over the stop layer to fill the recess. The method continues with an operation 208 in which the material layer is thinned. In some embodiments, the material layer is thinned until the stop layer is exposed. Then, the method continues with an operation 210 in which the material layer is removed from the recess to expose the stop layer. Afterwards, the method continues with an operation 212 in which the stop layer is thinned to expose the structure and the sidewall and the bottom of the recess.

Figure 3A:
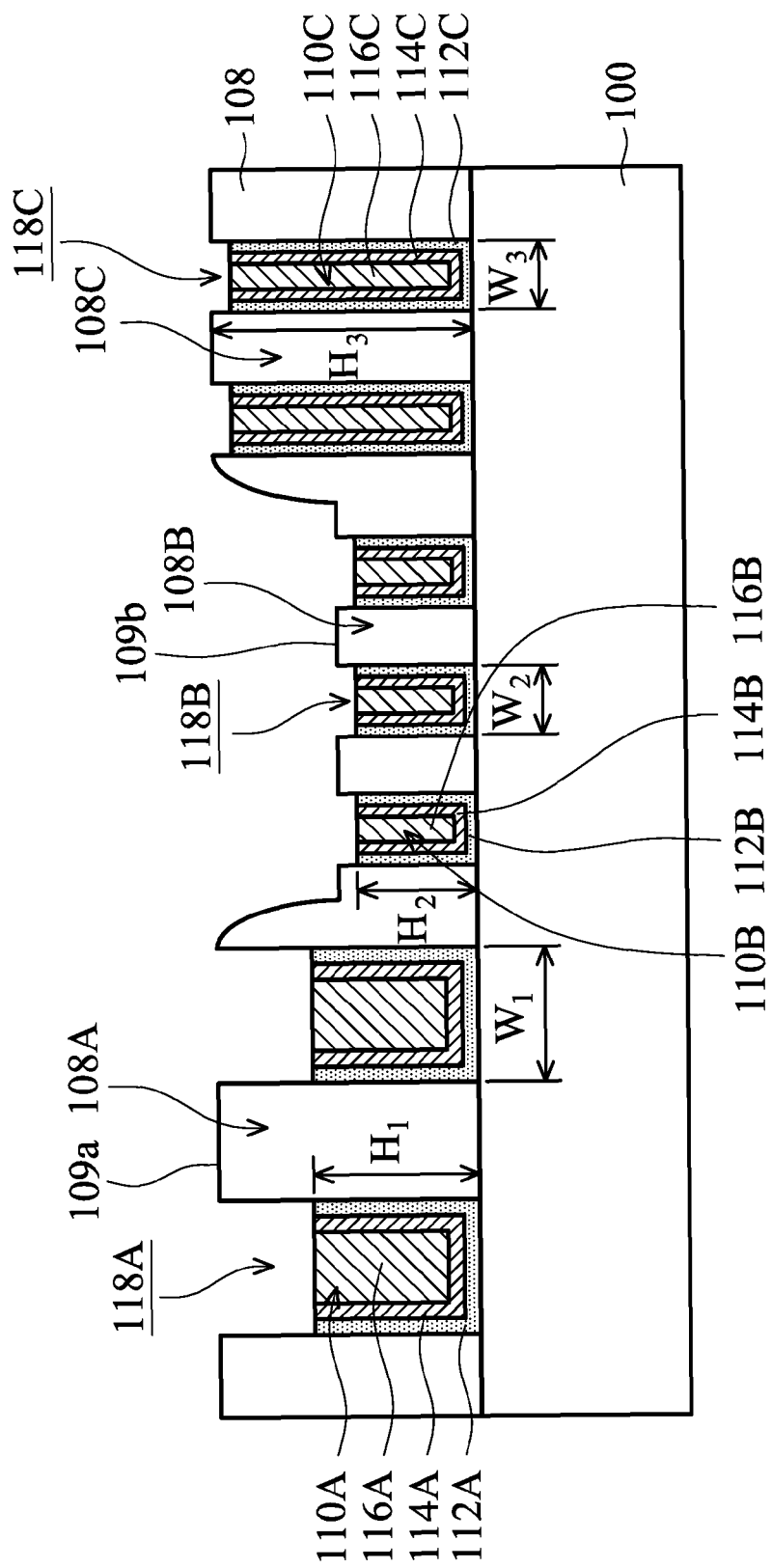
FIGS. 3A-3D are cross-sectional views of various stages of a process for forming a semiconductor device structure, in accordance with some embodiments.

FIGS. 3A-3D are cross-sectional views of various stages of a process for forming a semiconductor device structure, in accordance with some embodiments. As shown in FIG. 3A, a structure similar to the structure shown in FIG. 1C is provided. In some embodiments, the dielectric layer 108 has a third portion 108C, as shown in FIG. 3A. The third portion 108C surrounds multiple metal gate stacks 110C. The metal gate stacks 110C may include a gate dielectric layer 112C, a work function layer 114C, and a conductive filling layer 116C.

In some embodiments, the metal gate stacks 110C are also etched back together with the metal gate stacks 110A and 110B. Therefore, recesses 118C are formed on the metal gate stacks 110C. As shown in FIG. 3A, each of the metal gate stacks 110C has a height $H_3$ and a width $W_3$. In some embodiments, the height $H_3$ is greater than the height $H_1$ or $H_2$. In some embodiments, the width $W_3$ is smaller than the width $W_1$. In some embodiments, the width $W_3$ is substantially equal to the width $W_2$. In some other embodiments, the widths $W_3$ and $W_2$ are different from each other.

Figure 3B:
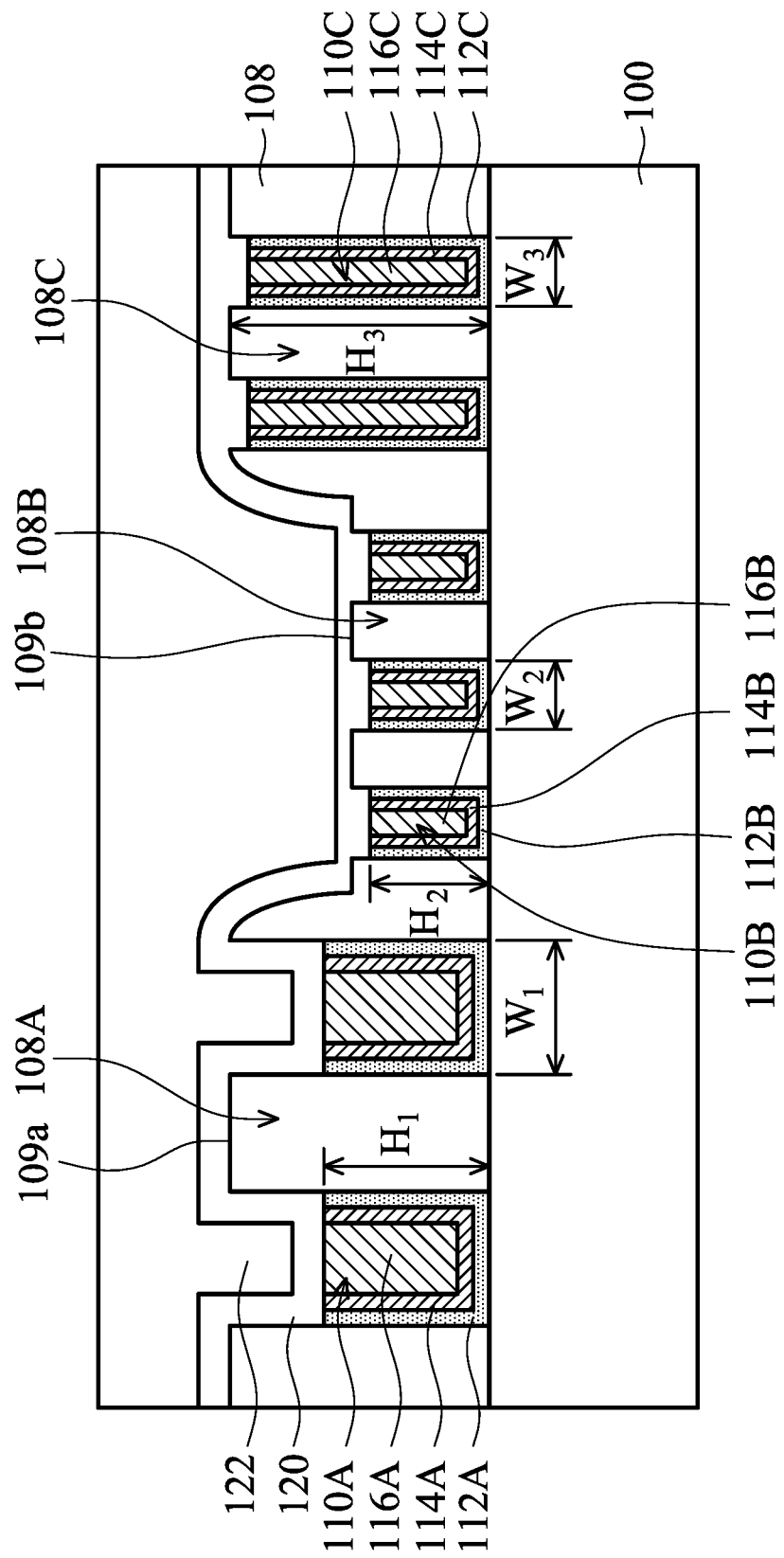

As shown in FIG. 3B, similar to the embodiments illustrated in FIG. 1D, the material layer 120 and the second material layer 122 are formed, in accordance with some embodiments. In some embodiments, the material layer 120 fills the recesses 118C on the metal gate stacks 110C. In some embodiments, the second material layer 122 does not extend into the recesses 118C on the metal gate stacks 110C, as shown in FIG. 3B.

Figure 3C:
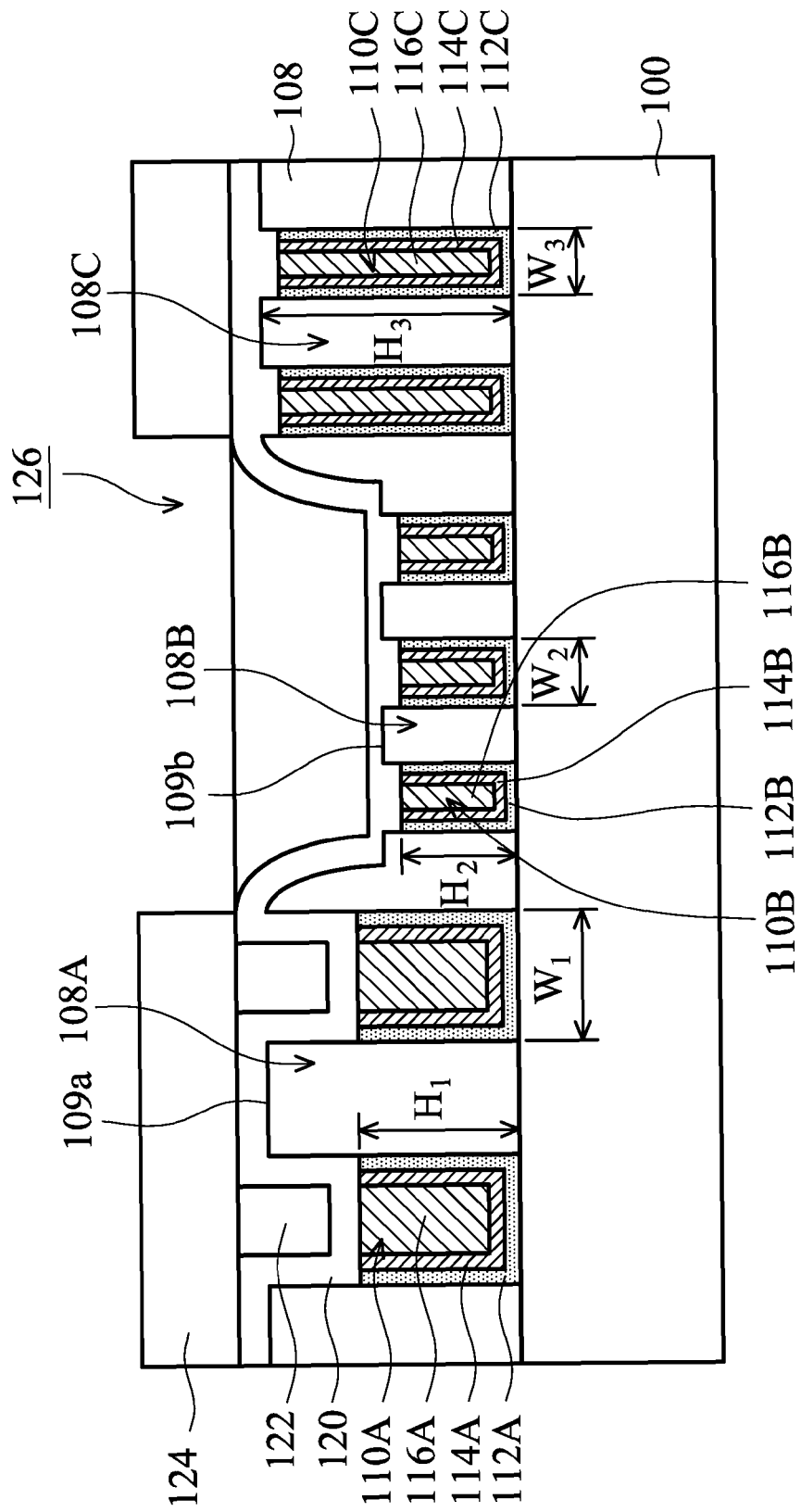

As shown in FIG. 3C, similar to the embodiments shown in FIGS. 1E and 1F, the second material layer 122 is thinned to expose the material layer 120, in accordance with some embodiments. Afterwards, the mask layer 124 is formed. The opening 126 exposes the second material layer 122, as shown in FIG. 3C.

Figure 3D:
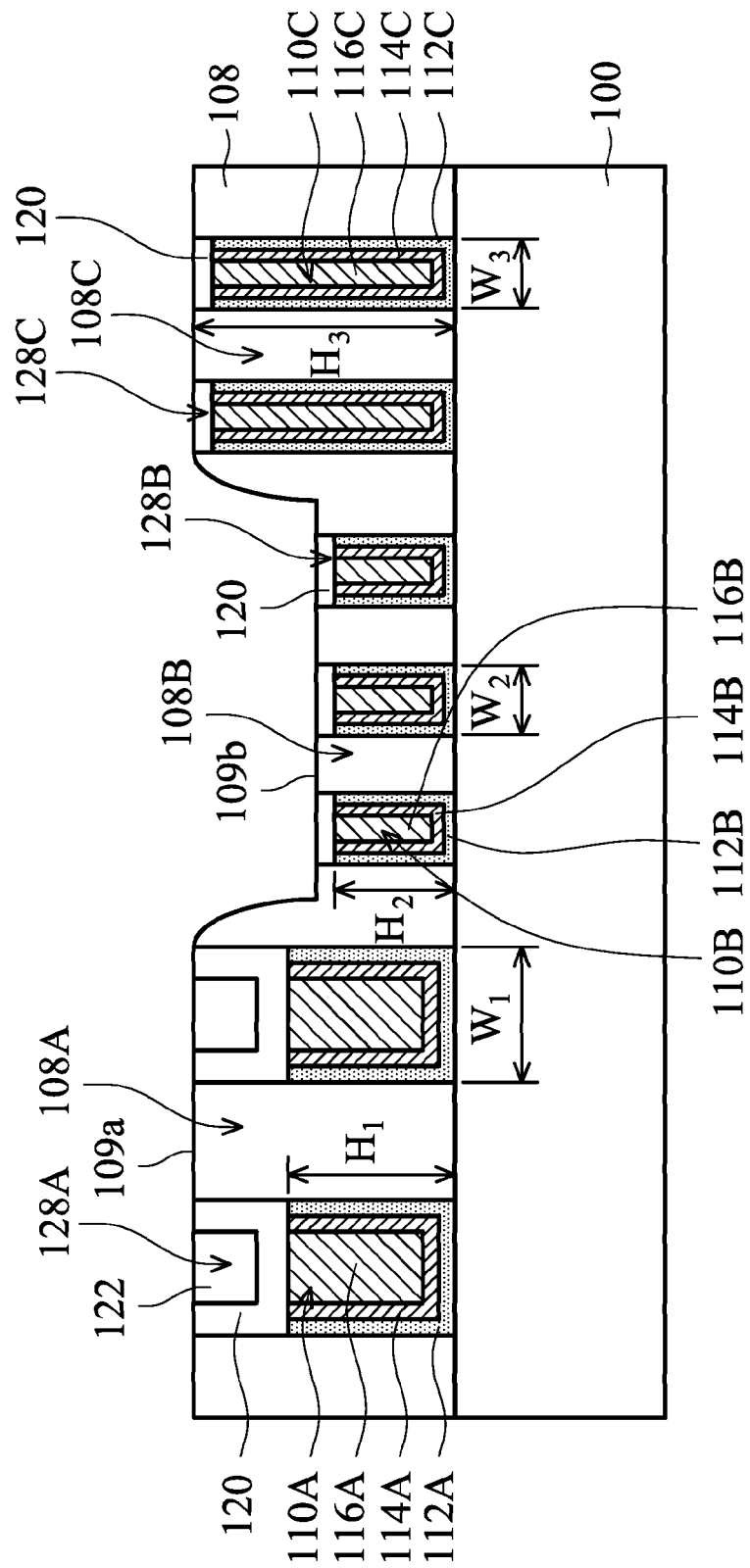

Afterwards, processes similar to the embodiments illustrated in FIGS. 1G and 1H are performed to form the structure shown in FIG. 3D, in accordance with some embodiments. As shown in FIG. 3D, the remaining portions of the material layer 120 on the metal gate stacks 110C form cap elements 128C. As illustrated in FIGS. 3A-3D, the processes described in FIGS. 1A-1H may also be applied even if the widths of the metal gate stacks 110B and 110C are substantially the same.

Embodiments of the disclosure form a lower and an upper material layers over a substrate (or a structure) having a recess to achieve conformal polishing. A planarization process, such as a CMP process, is used to remove the upper material layer until the lower layer (that acts as a CMP stop layer) is exposed. Afterwards, a photolithography process and an etching process are used to remove a remaining portion of the upper material layer filling the recess to expose the lower material layer that now acts as an etch stop layer. As a result, the remaining portions of the lower material layer on the top surface of the substrate and in the recess have substantially the same thickness. Another CMP process is performed to remove the lower material layer. During the CMP process, the material loss of the lower material layer on the top surface of the substrate is substantially the same as the material loss of the lower material layer on the bottom or sidewall of the recess. The CMP process substantially does not damage the substrate (or the structure). Therefore, the substrate (or the structure) or other elements under the lower material layer are prevented from being damaged or removed. The quality and reliability of the semiconductor device structure are therefore improved.

In accordance with some embodiments, a method for forming a semiconductor device structure is provided. The method includes receiving a structure having a first portion and a second portion, and a top surface of the first portion is higher than a top surface of the second portion. The method also includes forming a first material layer over the first portion and the second portion of the structure and forming a first material layer over the first portion and the second portion of the structure. The method further includes thinning the second material layer until the first material layer is exposed and removing a portion of the second material layer over the second portion of the structure to expose the first material layer thereunder. In addition, the method includes thinning the first material layer to expose the structure.

In accordance with some embodiments, a method for forming a semiconductor device structure is provided. The method includes receiving a structure having a recess and forming a stop layer over the structure, and the stop layer extends on a sidewall and a bottom of the recess. The method also includes forming a material layer over the stop layer to fill the recess and thinning the material layer until the stop layer is exposed. The method further includes removing the material layer from the recess to expose the stop layer and thinning the stop layer to expose the structure and the sidewall and the bottom of the recess.

In accordance with some embodiments, a method for forming a semiconductor device structure is provided. The method includes forming a first metal gate stack and a second metal gate stack over a semiconductor substrate, and a top of the first metal gate stack is higher than a top of the second metal gate stack. A dielectric layer surrounds the first metal gate stack and the second metal gate stack. The dielectric layer has a first portion with a first top surface substantially coplanar with the top of the first metal gate stack and a second portion with a second top surface substantially coplanar with the top of the second metal gate stack. The method also includes etching back the first metal gate stack and the second metal gate stack to form a first recess and a second recess on the first metal gate stack and the second metal gate stack, respectively. The method further includes forming a first material layer over the dielectric layer such that the first material layer extends into the first recess and fills the second recess and forming a second material layer over the first material layer. In addition, the method includes thinning the second material layer until the first material layer is exposed and removing a portion of the second material layer over the second portion of the dielectric layer to expose a portion of the first material layer over the second portion of the dielectric layer. The method further includes thinning the first material layer and the second material layer to expose the first portion and the second portion of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   receiving a structure having a first portion and a second portion, wherein a top surface of the first portion is higher than a top surface of the second portion;
   forming a first material layer over the first portion and the second portion of the substrate;
   forming a second material layer over the first material layer;
   partially removing the second material layer until the first material layer is exposed, wherein the second material layer is partially removed using a first polishing process;
   after the first polishing process, removing a portion of the second material layer over the second portion of the structure to expose the first material layer thereunder; and
   after the portion of the second material layer over the second portion of the structure is removed, partially removing the first material layer and the second material layer to expose a portion of the structure, wherein the first material layer and the second material layer are partially removed using a second polishing process.

2. The method for forming a semiconductor device structure as claimed in claim 1, wherein the first polishing process is a chemical mechanical polishing process.

3. The method for forming a semiconductor device structure as claimed in claim 1, further comprising:
   forming a mask layer over the first material layer after the first polishing process; and
   forming an opening in the mask layer, wherein the opening exposes the second material layer over the second portion of the structure.

4. The method for forming a semiconductor device structure as claimed in claim 3, wherein the mask layer is a patterned photoresist layer.

5. The method for forming a semiconductor device structure as claimed in claim 1, wherein the second polishing process is a chemical mechanical polishing process.

6. The method for forming a semiconductor device structure as claimed in claim 1, wherein the first material layer and the second material layer are made of different materials.

7. The method for forming a semiconductor device structure as claimed in claim 1, wherein the first portion of the structure comprises a first metal gate stack, and the second portion of the structure comprises a second metal gate stack.

8. The method for forming a semiconductor device structure as claimed in claim 7, wherein a first height of the first metal gate stack is greater than a second height of the second metal gate stack.

9. The method for forming a semiconductor device structure as claimed in claim 8, wherein the first metal gate stack is wider than the second metal gate stack.

10. The method for forming a semiconductor device structure as claimed in claim 1, wherein the second material layer is thicker than the first material layer.

11. A method for forming a semiconductor device structure, comprising:
    receiving a structure having a recess;
    forming an etch stop layer over the structure, wherein the etch stop layer extends on a sidewall and a bottom of the recess;
    forming a material layer over the stop layer to fill the recess;
    partially removing the material layer until the etch stop layer is exposed, wherein the material layer is partially removed using a first polishing process;
    after the first polishing process, partially removing the material layer from the recess to expose a portion of the etch stop layer; and
    after the material layer is partially removed from the recess, partially removing the etch stop layer and the material layer to expose a portion of the structure and the sidewall and the bottom of the recess, wherein the etch stop layer and the material layer are partially removed using a second polishing process.

12. The method for forming a semiconductor device structure as claimed in claim 11, wherein the first polishing process is a chemical mechanical polishing process.

13. The method for forming a semiconductor device structure as claimed in claim 11, wherein the second polishing process is a chemical mechanical polishing process.

14. The method for forming a semiconductor device structure as claimed in claim 11, further comprising:
    forming a mask layer to cover the etch stop layer after the first polishing process, wherein the mask layer has an opening exposing the material layer filling the recess; and
    removing the mask layer after the removal of the material layer from the recess.

15. The method for forming a semiconductor device structure as claimed in claim 11, wherein top surfaces of the material layer and the etch stop layer are substantially coplanar with each other after the first polishing process and before the removal of the material layer from the recess.

16. A method for forming a semiconductor device structure, comprising:
    forming a first metal gate stack and a second metal gate stack over a semiconductor substrate, wherein a top of the first metal gate stack is higher than a top of the second metal gate stack, a dielectric layer surrounds the first metal gate stack and the second metal gate stack, and the dielectric layer has a first portion with a first top surface substantially coplanar with the top of the first metal gate stack and a second portion with a second top surface substantially coplanar with the top of the second metal gate stack;
    etching back the first metal gate stack and the second metal gate stack to form a first recess and a second recess on the first metal gate stack and the second metal gate stack, respectively;
    forming a first material layer over the dielectric layer such that the first material layer extends into the first recess and fills the second recess;
    forming a second material layer over the first material layer;
    partially removing the second material layer until the first material layer is exposed, wherein the second material layer is partially removed using a first polishing process;
    removing a portion of the second material layer over the second portion of the dielectric layer to expose a portion of the first material layer over the second portion of the dielectric layer; and partially removing the first material layer and the second material layer to expose the first portion and the second portion of the dielectric layer using a second polishing process.

17. The method for forming a semiconductor device structure as claimed in claim 16, further comprising forming a mask layer over the first material layer after the first polishing process, wherein the mask layer has an opening exposing the second material layer over the second portion of the dielectric layer.

18. The method for forming a semiconductor device structure as claimed in claim 17, further comprising removing the mask layer after the removal of the portion of the second material layer over the second portion of the dielectric layer and before the second polishing process.

19. The method for forming a semiconductor device structure as claimed in claim 16, wherein the first metal gate stack is wider than the second metal gate stack.

20. The method for forming a semiconductor device structure as claimed in claim 16, wherein the first material layer comprises silicon nitride, and the second material layer comprises silicon oxide.

\* \* \* \* \*